United States Patent [19]

Gaumet et al.

[11] Patent Number: 5,640,306
[45] Date of Patent: Jun. 17, 1997

[54] CONTACTLESS SMART CARD THE ELECTRONIC CIRCUIT OF WHICH COMPRISES A MODULE

[75] Inventors: Michel Gaumet, Saint Denis en Val; Alain D. Larchevesque, Ferolles, both of France

[73] Assignee: Solaic (Societe anonyme), France

[21] Appl. No.: 492,483

[22] Filed: Jun. 20, 1995

[30] Foreign Application Priority Data

Jun. 22, 1994 [FR] France ................................ 94 07657

[51] Int. Cl.⁶ .................................................. H05K 1/14
[52] U.S. Cl. ........................ 361/737; 361/728; 361/764; 361/803; 257/679; 174/52.1
[58] Field of Search ............................... 361/737, 736, 361/749, 684, 760–764, 750, 751, 767, 768, 772, 776–777, 783, 790, 803, 773; 257/773, 679, 787, 723–724; 439/68–69, 71–72, 74, 329–330, 83; 235/487–488, 490, 492; 174/254, 260, 52.1; 29/829–831

[56] References Cited

U.S. PATENT DOCUMENTS

| | | |
|---|---|---|
| 4,731,645 | 3/1988 | Parmentier et al. . |
| 4,843,225 | 6/1989 | Hoppe . |
| 5,027,190 | 6/1991 | Haghiri-Tehrani et al. ............ 257/679 |
| 5,148,266 | 9/1992 | Khandros et al. ...................... 257/773 |

FOREIGN PATENT DOCUMENTS

| | | | |
|---|---|---|---|
| 2051836 | 5/1992 | Canada . | |
| 2 686 996 | 8/1993 | France . | |
| 137335 | 6/1986 | Japan ................................. | 437/219 |
| 138967 | 6/1991 | Japan . | |

Primary Examiner—Leo P. Picard
Assistant Examiner—Anthony Dinkins
Attorney, Agent, or Firm—Anthony J. Casella; Gerald E. Hespos

[57] ABSTRACT

The contactless smart card according to the invention is provided with an electronic circuit which is physically inaccessible from the outside and including, on an insulating film (12), electronic components connected by conductive elements (11). According to the invention, at least one of the components of the electronic circuit is formed by a module (1) including an insulating support (2) provided with holes (3, 4), a printed circuit (5, 6) located on one of the faces of the insulating support, an integrated circuit (7) located on the side of the other face of the insulating support and electrically connected to the printed circuit by lead wires (8) passing through holes in the insulating support, and a protective insulating material (9) encapsulating the integrated circuit (7) and the lead wires (8), the printed circuit of the module (1) being held by a conductive material (10) against the conductive elements (11) borne by the insulating film (12).

14 Claims, 2 Drawing Sheets

CONTACTLESS SMART CARD THE ELECTRONIC CIRCUIT OF WHICH COMPRISES A MODULE

The present invention relates to a contactless smart card provided with an electronic circuit which is physically inacessible from the outside and including, on an insulating film, electronic components connected by conductive elements.

Contactless smart cards are currently expensive to manufacture, particularly when they are provided with a complex electronic circuit. Indeed, their manufacture necessitates sophisticated facilities involving major investments and yet yielding only limited production rates.

The present invention proposes to provide a solution to this problem and, to do so, it provides a contactless smart card, constituted as aforementioned, and which is characterized in that at least one of the components of the electronic circuit is formed by a module including an insulating support provided with holes, a printed circuit located on one of the faces of the insulating support, an integrated circuit located on the side of the other face of the insulating support and electrically connected to the printed circuit by lead wires passing through holes in the insulating support, and a protective insulating material encapsulating the integrated circuit and the lead wires, the printed circuit of this module being held by a conductive material against the conductive elements borne by the insulating film.

The module used in the contactless smart card according to the invention is a semifinished product of the type manufactured on a very large scale and at a high production rate for conventional smart cards the contacts of which are visible.

It is thus possible to manufacture it very economically by using the same techniques as those with which the modules of conventional cards are currently manufactured.

Moreover, its installation in the electronic circuits of contactless smart cards can be automated, thus making it possible to manufacture these cards at very fast rates and at a low cost price.

The module has to be secured against the conductive elements of the insulating film in a predetermined precise position in order for the smart card to be able to function properly.

When the modules are stored with their printed circuits facing upwards, they can be positioned correctly on the insulating film without difficulty. In this case, it suffices, in fact, to take as a reference point a particular element of their printed circuits that has an assymetrical structure in order to arrange them in the correct position on the insulating film.

On the other hand, when the modules are stored with their printed circuits facing downwards, it takes considerable time to place them correctly on the insulating film since their printed circuits are not directly locatable.

To overcome this drawback, the present invention provides for the module to have a reference point on its face opposed to the printed circuit.

Thus, thanks to this reference point, the module can be correctly placed on the insulating film without any need for trial and error, which makes it possible to increase card production rates.

Preferably, the reference point is formed by at least a hole provided in the insulating support, this hole being closable by the printed circuit.

The contactless smart card according to the invention is characterized, furthermore, in that the insulating film is provided, on its face bearing the electronic components, with a layer of insulating material covering the latter, this layer providing perfect protection for the electronic circuit from external aggressive influences.

In order to enhance the protection of the electronic circuit yet further, the other face of the insulating film can also be provided with a second layer of insulating material.

One form of embodiment of the present invention will now be described by way of a by no means limitative example with reference to the annexed drawings, wherein.

Figure 1:
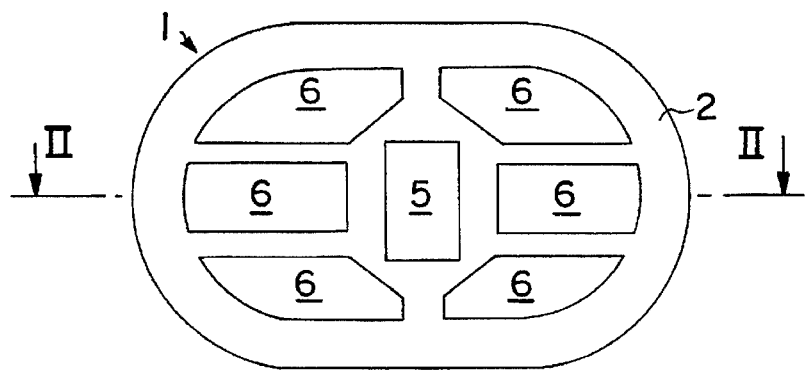
FIG. 1 is a top view of a module intended for incorporation in the electronic circuit of a contactless smart card according to the invention.
Figure 2:
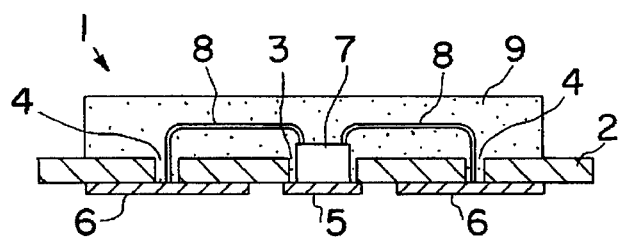
FIG. 2 is a cross-sectional view along line II—II of FIG. 1.
Figure 3:
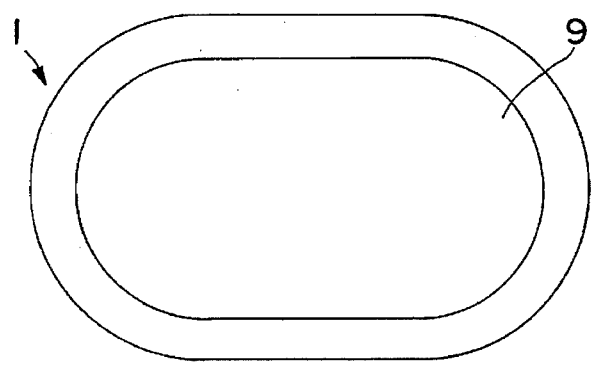
FIG. 3 is a bottom view of the module shown in FIG. 1.

Module 1 shown in FIGS. 1 to 3 includes an insulating support 2 provided with a central hole 3 and peripheral holes 4, a printed circuit formed by a central conductive element 5 and lateral conductive elements 6 borne by one of the faces of the insulating support 2, an integrated circuit 7 fixed onto the central conductive element 5, on the central hole 3 side, and electrically connected to the lateral conductive elements 6 by lead wires 8 passing through the peripheral holes 4, and a protective insulating material 9 encapsulating integrated circuit 7 and lead wires 8.

Insulating support 2 is made of a plastic material, preferably polyimide or glass fiber reinforced epoxy material. Conductive elements 5 and 6 of the printed circuit can, for their part, be produced, for example, by etching, by electrolytic deposition of metallic layers or by the silk screen deposition of a conductive ink.

Figure 4:
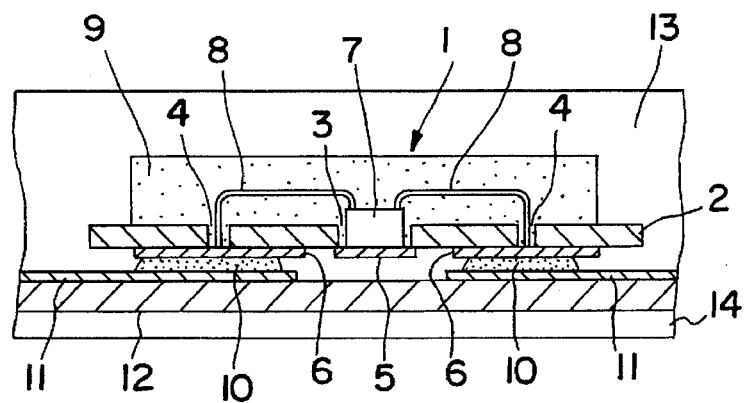
FIG. 4 is a schematic view in partial cross-section of a contactless smart card according to the invention, with the module shown in FIGS. 1 to 3 forming one of the components of the electronic circuit of this card.

According to the invention, the lateral conductive elements 6 are connected, via a conductive glue 10, to conductive elements 11 deposited on one of the faces of an insulating film 12 and which, as in the case of module 1, form part of the electronic circuit of the contactless smart card shown in partial, schematic cross-section in FIG. 4.

The electronic circuit of this card comprises a certain number of electronic components (not shown) in addition to module 1, these components possibly being composed, for example, of capacitors, resistors, antennas, etc.

It is physically inaccessible from the outside. Indeed, in the example shown in FIG. 4, the body of the card is formed of two layers of insulating plastic material, 13, 14, fixed respectively against the two faces of insulating film 12.

Module 1 can be fixed quickly in the appropriate position against the conductive elements 11 when it is stored with its printed circuit facing upwards. In this case, the operator can, in fact, use one of the conductive elements 5, 6 of the printed circuit as a reference point for identifying without hesitation the position in which he has to fix the module against the conductive elements.

On the other hand, when the module is stored with its printed circuit facing downwards, the operator needs more time to identify the fixing position of the said module.

Figure 5:
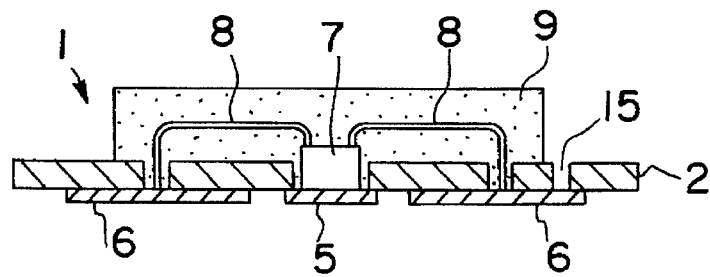
FIG. 5 is a cross-sectional view of a module according to a first alternative form of embodiment, this view being analogous to that of FIG. 2.
Figure 6:
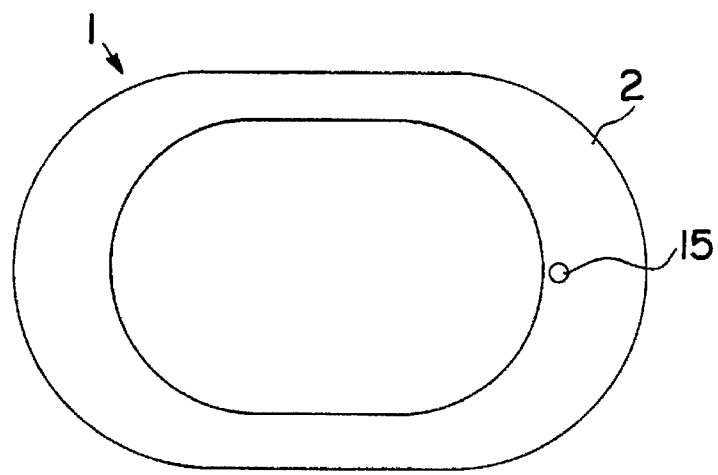
FIG. 6 is a bottom view of the module shown in cross-section in FIG. 5.
Figure 7:
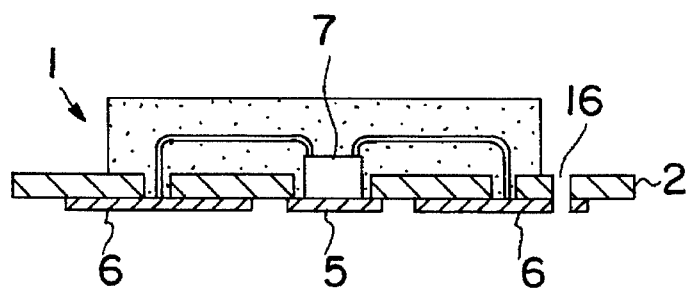
FIG. 7 is a cross-sectional view of a module according to a second alternative form of embodiment.

In order to facilitate this identification, the insulating support 2 of the module can be provided with one or more holes 15, one of the ends of which is blocked by one of the conductive elements 6 of the printed circuit, as shown in FIG. 5. Alternatively, support 2 and one of conductive elements 6 can be provided with a hole 16, as shown in FIG. 7.

It will be readily appreciated that, thanks to hole 15 or hole 16, the operator has at his disposal a reference point enabling him to identify, without any need for trial and error, the position in which he has to present module 1 to fix it in the appropriate position against conductive elements 11.

It goes without saying that the fixing of module 1 against conductive elements 11 could be automated; the installation used could advantageously comprise detection means capable of locating a particular conductive element of the printed circuit, or the hole 15 or 16 provided in insulating support 2.

We claim:

1. Contactless smart card provided with an electronic circuit which is physically inaccessible from the outside and including, on an insulating film (12), electronic components connected by conductive elements (11), characterized in that:

at least one of the components of the electronic circuit is formed by a module (1) including:

an insulating support (2) provided with holes (3, 4), a printed circuit (5, 6) located on one of the faces of the insulating support, an integrated circuit (7) located on the side of the other face of the insulating support, lead wires (8) electrically connected to the side of the integrated circuit away from said other face and to the printed circuit by passing through holes in the insulating support, and a protective insulating material (9) encapsulating the integrated circuit and the lead wires, the printed circuit of this module being held by a conductive material (10) against the conductive elements (11) borne by the insulating film (12).

2. Smart card according to claim 1, characterized in that the module (1) has a reference point (15, 16) on its face opposed to the printed circuit.

3. Smart card according to claim 2, characterized in that the reference point is formed by at least one hole (15, 16) provided in the insulating support (2).

4. Smart card according to claim 2, characterized in that the insulating film (12) is provided, on its face bearing the electronic components, with a layer of insulating material (13) covering the latter.

5. Smart card according to claim 1, characterized in that the insulating film (12) is provided, on its face bearing the electronic components, with a layer of insulating material (13) covering the latter.

6. Smart card according to claim 5, characterized in that the other face of the insulating film (12) is provided with a second layer of insulating material (14).

7. Contactless smart card, provided with an electronic circuit which is physically inaccessible from the outside and including, on an insulating film (12), electronic components connected by conductive elements (11), characterized in that at least one of the components of the electronic circuit is formed by a module (1) including an insulating support (2) provided with holes (3, 4), a printed circuit (5, 6) located on one of the faces of the insulating support, an integrated circuit (7) located on the side of the other face of the insulating support and electrically connected to the printed circuit by lead wires (8) passing through holes in the insulating support, and a protective insulating material (9) encapsulating the integrated circuit and the lead wires, the printed circuit of this module being held by a conductive material (10) against the conductive elements (11) borne by the insulating film (12) and said module (1) having a reference point (15, 16) on its face opposed to the printed circuit, the reference point being formed by at least one hole (15, 16) provided in the insulating support (2) and the hole (15) is blocked by the printed circuit.

8. Smart card according to claim 7, characterized in that the insulating film (12) is provided, on its face bearing the electronic components, with a layer of insulating material (13) covering the latter.

9. Smart card according to claim 7, characterized in that the insulating film (12) is provided, on its face bearing the electronic components, with a layer of insulating material (13) covering the latter.

10. Smart card according to claim 9, characterized in that the other face of the insulating film (12) is provided with a second layer of insulating material (14).

11. Contactless smart card, provided with an electronic circuit which is physically inaccessible from the outside and including, on an insulating film (12), electronic components connected by conductive elements (11), characterized in that at least one of the components of the electronic circuit is formed by a module (1) including an insulating support (2) provided with holes (3, 4), a printed circuit (5, 6) located on one of the faces of the insulating support, an integrated circuit (7) located on the side of the other face of the insulating support and electrically connected to the printed circuit by lead wires (8) passing through holes in the insulating support, and a protective insulating material (9) encapsulating the integrated circuit and the lead wires, the printed circuit of this module being held by a conductive material (10) against the conductive elements (11) borne by the insulating film (12) and said module (1) having a reference point (15, 16) on its face opposed to the printed circuit, the reference point being formed by at least one hole (15, 16) provided in the insulating support (2) and the insulating film (12) is provided, on its face bearing the electronic components, with a layer of insulating material (13) covering the latter.

12. Smart card according to claim 11, characterized in that the insulating film (12) is provided, on its face bearing the electronic components, with a layer of insulating material (13) covering the latter.

13. Smart card according to claim 12, characterized in that the other face of the insulating film (12) is provided with a second layer of insulating material (14).

14. Smart card according to claim 11, characterized in that the insulating film (12) is provided, on its face bearing the electronic components, with a layer of insulating material (13) covering the latter.

* * * * *